United States Patent [19]

Gualtieri

[11] Patent Number: 5,086,549

[45] Date of Patent: Feb. 11, 1992

[54] METHOD OF PREPARING A LUMBERED QUARTZ BAR FOR SWEEPING AND THEN SWEEPING SAID LUMBERED QUARTZ BAR

[75] Inventor: John G. Gualtieri, Oceanport, N.J.

[73] Assignee: The United States of America as represented by the Secretary of the Army, Washington, D.C.

[21] Appl. No.: 591,317

[22] Filed: Oct. 1, 1990

[51] Int. Cl.$^5$ .................................... H04R 17/00
[52] U.S. Cl. ........................... 29/23.35; 204/192.15
[58] Field of Search ............... 29/25.35; 204/192.15

[56] References Cited

U.S. PATENT DOCUMENTS

| H952 | 8/1991 | Gualtieri | 430/313 |
|---|---|---|---|
| 4,311,938 | 1/1982 | Ballato et al. | 29/25.35 |
| 4,916,470 | 4/1990 | Kovacs et al. | 346/160 |

Primary Examiner—P. W. Echols
Attorney, Agent, or Firm—Michael Zelenka; Roy E. Gordon

[57] ABSTRACT

The use of electrically conducting oxides, that permit the diffusion of hydrogen through the electrode material, as electrodes in the air-or H-sweeping of quartz.

6 Claims, 1 Drawing Sheet

METHOD OF PREPARING A LUMBERED QUARTZ BAR FOR SWEEPING AND THEN SWEEPING SAID LUMBERED QUARTZ BAR

GOVERNMENT INTEREST

The invention described herein may be manufactured, used, and licensed by or for the Government for governmental purposes without the payment to me of any royalty thereon.

FIELD OF THE INVENTION

This invention relates in general to a method of sweeping quartz and in particular to a method of air- or H-sweeping quartz using electrically conducting sputtered oxide electrode films that are amorphous and subject to easy diffusion of hydrogen.

BACKGROUND OF THE INVENTION

Sweeping is a purification process that removes certain impurities and thereby improves the radiation and etching properties of quartz crystals. It is an electric-field driven, high-temperature, solid-state diffusion process. The major steps of a typical sweeping process include: applying electrodes to the Z-surfaces of a lumbered quartz bar; applying voltage to the electrodes to produce an electric field of approximately 1 KV/cm; heating the bar slowly in either air, vacuum, or in hydrogen-containing or inert atmospheres to about 500° C; monitoring the current through the bar (as sweeping progresses, the current decreases); when the current decays to some near-constant value, cooling the bar slowly to room temperature, and removing the voltage.

Alkali metal impurities, such as $Li^+$ and $Na^+$ are charge compensators for trivalent aluminum impurities in quartz. When sweeping is performed in air or $H_2$, the alkalis diffuse to the cathode and are replaced by the indiffusion of hydrogen at the anode. The alkali-metal impurities are subsequently removed by lapping the Z-surfaces. The sweeping process also modifies dislocations, reducing the tendency for the formation of etch channels. Thus, sweeping can provide a substantial improvement in quartz resonator etch-processibility.

Heretofore, either evaporated-metal or metal foil electrodes have been used for sweeping quartz material as for example, electrodes for quartz resonator devices and interdigital transducer (IDT) fingers in surface acoustic wave (SAW) devices.

The difficulty with evaporated-metal or metal foil electrodes is that they are subject to suppression of hydrogen diffusion and nonuniformities derived from discontinuous areal contact of the electrode with the quartz.

SUMMARY OF THE INVENTION

The general object of this invention is to provide an improved method of preparing an electrode for use in sweeping quartz, and then sweeping the quartz. A more particular object of the invention is to provide such a method of preparing an electrode and sweeping with that electrode that allows the diffusion of hydrogen, that adheres to the quartz, that experiences little or no stress relief voiding and that is chemically inert with respect to $SiO_2$.

It has now been found that the aforementioned objects can be attained by-air-or H-sweeping quartz using electrically conducting sputtered oxide electrode films that are amorphous (non-crystalline) and subject to easy diffusion of hydrogen.

Sputtered (electrically conducting) oxide films are amorphous and allow diffusion of hydrogen. Because the films remain amorphous during the sweeping process, they experience little or no stress-relief voiding associated with amorphous to crystalline transitions and further grain growth of metal crystal film. For these reasons, conducting oxide electrodes maintain uniform adherence to the quartz even after temperature cycling and prolonged high-temperature annealing encountered during the sweeping process. For this reason, these films are superior to evaporated metallizations used as electrodes for quartz resonator devices and as IDT fingers for SAW devices. Their use as sweeping electrodes results in adequate hydrogen diffusion through the film to enable H-penetration of the quartz and H-replacement of alkali at Al-impurity sites in the quartz lattice. Uniform replacement of alkali with hydrogen across the sample bar (from anode to cathode) is found when these electrodes are used. Uniform sweeping with respect to areal contact is also maintained because the films allow diffusion of hydrogen and do not require openings or voids to create three-phase regions, or regions where water vapor/hydrogen, quartz and electrode coexist.

The electrically conducting oxide films are also chemically inert with respect to $SiO_2$. That is, using Rutherford Backscattering Spectroscopy (RBS), chemical reactions and interdiffusion of constituents with $SiO_2$ have not been observed using a desirable oxide film such as amorphous Y-Ba-Cu-O film.

DESCRIPTION OF THE DRAWING

FIG. a diagram of a lumbered Y-bar, 1, used for sweeping. Z-surfaces, 2, are polished to a 1 μm finish, then chemically polished. Amorphous Y-Ba-Cu-O films, 3, are sputtered onto the polished Z-surfaces. Gold lead-in wire, 4, is pressed to the electrodes for electrical contact.

DETAILED DESCRIPTION OF THE DRAWING AND THE PREFERRED EMBODIMENT

A lumbered bar (Y-bar, SC-bar, etc.) of quartz, 1, is used as the material to be swept. Y-Ba-Cu-O electrodes are to be deposited onto the Z-surfaces of the lumbered bar. The Z-surfaces, 2, are mechanically lapped and polished until at least 0.2 mm is removed from each surface. This removes the bulk etching using $NH_4F:HF=1:1$ at 75° C. for 10 minutes or until 25 μm is removed from each surface. This serves to remove all traces of remaining surface damage. Surface damage is removed to decrease the possibility of the diffusion of electrode constituents into the quartz during the sweeping process.

All surfaces are cleaned using ultrasonic cleaning steps of: trichlorethane; hot detergent; alcohol; and distilled water. As a final step, the bars are cleaned in oxygen plasma for two minutes prior to electroding.

Films of Y-Ba-Cu-O, 3, are grown only on the Z-surfaces of the quartz bars by magnetron sputtering from a single stoichiometric YBa$_2$Cu$_3$O$_7$ target. The films are grown at room temperature in flowing argon with a flow-rate of about 35 cc/min. The films are only annealed in flowing-air atmosphere with a flow rate of about 100 cc/min as part of the following temperature-ramped sweeping process. Electrical contact is achieved using gold wire, 4, pressed to the Y-Ba-Cu-O electrodes.

The sweeping process is started with the full DC voltage being applied at the start of sweeping, and maintained throughout the sweeping process. The bar temperature is increased from room temperature to not more than 500° C. at a rate of 20° C./hr. The temperature is then held constant at the maximum for a period of at least 24 hours, and long enough to insure that the current density is steady and no longer decaying. Finally, the temperature is decreased at 20° C./hr back to room temperature. At the conclusion of this procedure, at least 200 μm of material is removed from each Z-surface. Since sweeping moves impurities from the anode side to the cathode side of the bar, it is recommended that the cathode side coincide with the side nearest the original seed plate of the as-grown crystal bar.

Under the deposition and annealing conditions used here, the Y-Ba-Cu-O films are amorphous and remain amorphous if the annealing temperature remains at or below 500° C. the 1.75 μm thick films are transparent and copper colored. The amorphous to crystalline transition begins above 500° C. and annealing above 550° C. causes grain growth, voiding and tearing of the films. However, sweeping at temperatures at or below 500° C. ensures that the film will remain amorphous. Voiding or tearing of the films is not detected at sweeping temperatures at or below 500° C.

Figure 1:
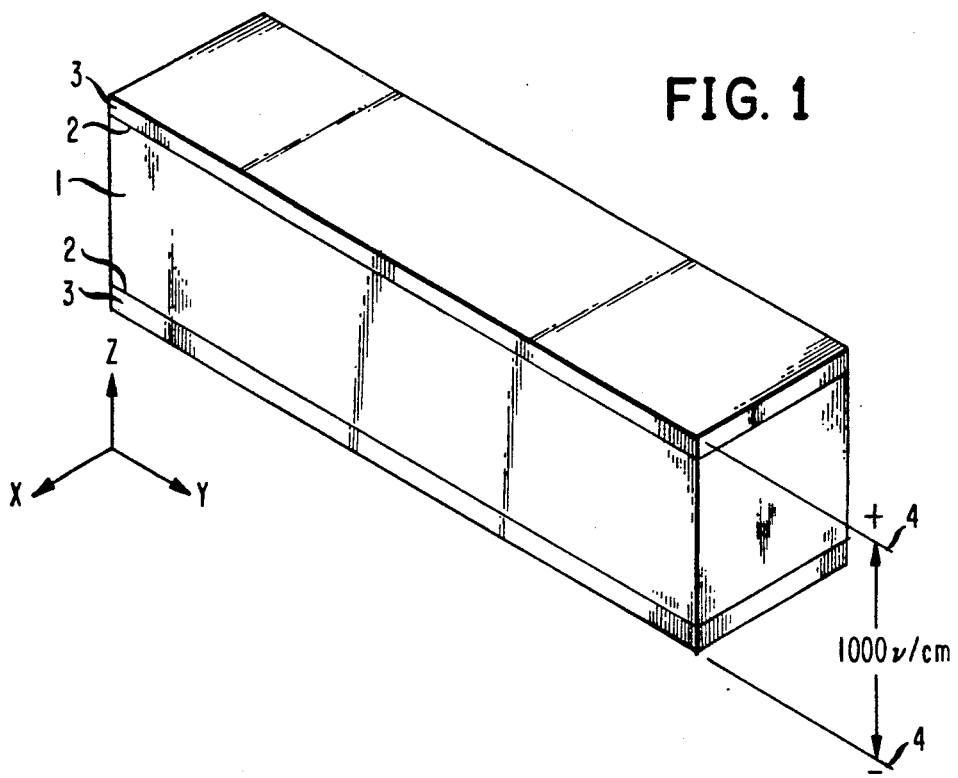
Figure 2:
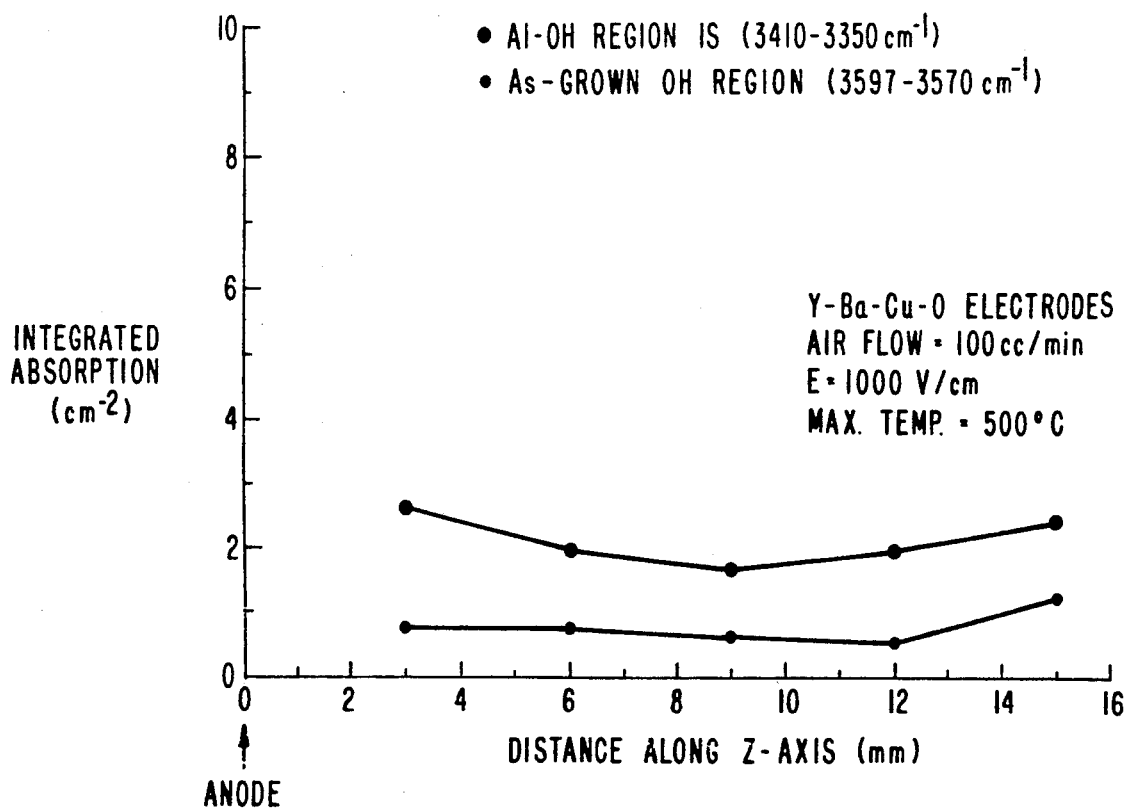
FIG. 2 the integrated absorption of a series of infrared scans using Y-Ba-Cu-O electrodes. The IR beam is unpolarized and in the X-direction (see FIG. 1). The Al-OH band and the as-grown OH bands are uniform along the Z-axis. The as-grown OH band is not depleted in the region near the anode (an indication that Al-hole compensation has not occurred).

Uniform indiffusion of hydrogen, to form Al-OH, occurs without any appearance of electron-hole compensation or color centers of Al as can be seen in FIG. 2. Sufficient hydrogen, derived from the hydrogen-containing atmosphere diffuses through the film. Therefore, voiding of the electrode and interfacial diffusion of hydrogen, necessary in the case of evaporated-metal electrodes, such as, Au/Cr (and a source of nonuniform sweeping) is not required for the Y-Ba-Cu-O electrodes.

Secondary ion mass spectroscopy (SIMS) techniques have shown that hydrogen is present in the Y-Ba-Cu-O/quartz interface after sweeping. RBS has revealed that no Y, Ba, or Cu metal constituents have diffused into the quartz.

The formulation of the Y-Ba-Cu-O when normalized to Ba$_2$ is Y$_{1.4}$Ba$_2$Cu$_{4.5}$O$_{12}$ and the thickness is 1.75 μm. Both formulation and thickness are not critical to the operation of these electrodes. However, the amorphous nature of the film is insured by limiting the maximum temperature to not more than 500° C. Other electrically conducting oxide films that can be used in the invention include LaCoO$_3$, PrCoO$_3$, In$_2$O$_3$, SnO$_2$ and mixtures of In$_2$O$_3$ and SnO$_2$.

The heart of the invention is the use of electrically conducting oxides, that permit the diffusion of hydrogen through the electrode material, as electrodes in the air-or-H-sweeping of quartz. Moreover, the use of amorphous films as sweeping electrodes insures that stress-relief cracking and voiding of the film, that leads to sweeping nonuniformities, is avoided.

I wish it to be understood that I do not desire to be limited to the exact details of construction shown and described for obvious modifications will occur to a person skilled in the art.

What is claimed is:

1. Method of preparing a lumbered bar of quartz for sweeping and then sweeping said lumbered quartz bar, said method including the steps of:
   (A) mechanically lapping and polishing the Z surfaces of the lumbered bar until at least the bulk of the surface damage caused by the lumbering process is removed,
   (B) chemically etching using NH$_4$F:HF=1:1 at 75° C. for 10 minutes to remove all traces of remaining surface damage,
   (C) cleaning all surfaces using ultrasonic cleaning steps followed by cleaning in an oxygen plasma for about two minutes,
   (D) growing electrically conducting sputtered oxide electrode films that are amorphous and subject to easy diffusion of hydrogen on the Z-surfaces of the quartz bar by magnetron sputtering from a single stoichiometric electrically conducting oxide target at room temperature in flowing argon,
   (E) applying a full DC voltage at the start of sweeping and maintaining that voltage throughout the sweeping process while the bar temperature is increased from room temperature to not more than 500° C. at a rate of 20° C./hr, the temperature then being held constant at the maximum for a period of at least 24 hours, and long enough to insure that the current density is steady, then decreasing the bar temperature at 20° C./hr to room temperature.

2. Method according to claim 1 wherein the electrically conducting sputtered oxide electrode film is selected from the group consisting of LaCoO$_3$, PrCoO$_3$, In$_2$O$_3$, SnO$_2$, Y-Ba-Cu-O mixtures of In$_2$O$_3$ and SnO$_2$.

3. Method according to claim 2 wherein the electrically conducting sputtered oxide electrode film is Y-Ba-Cu-O.

4. Method according to claim 1 wherein the electrically conducting sputtered oxide remains amorphous throughout the sweeping process.

5. Method according to claim 1 wherein the sweeping process is performed in an air atmosphere.

6. Method according to claim 1 wherein the sweeping process is performed in a hydrogen atmosphere.

* * * * *